US006477955B1

(12) United States Patent
Landsman

(10) Patent No.: US 6,477,955 B1
(45) Date of Patent: *Nov. 12, 2002

(54) LASER ABLATABLE WATERLESS LITHOGRAPHIC PRINTING MEMBER

(75) Inventor: Robert M. Landsman, Boynton Beach, FL (US)

(73) Assignee: Creo Il. Ltd., Herzlia (IL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/914,708

(22) Filed: Aug. 19, 1997

Related U.S. Application Data

(63) Continuation-in-part of application No. 07/607,720, filed on Nov. 1, 1990, now abandoned.

(51) Int. Cl.[7] .............................. B41N 1/08; B41N 1/14; B41C 1/10; G03F 7/20

(52) U.S. Cl. ....................... 101/457; 101/462; 101/467; 430/303

(58) Field of Search ................................ 101/136, 141, 101/174, 211, 376, 389.1, 395, 401, 401.1, 424.1, 453, 457, 458, 459, 462, 467, 477, 491, 463.1; 430/303

(56) References Cited

U.S. PATENT DOCUMENTS

| | | | | | |
|---|---|---|---|---|---|
| 2,663,254 | A | * | 12/1953 | Parrish | 101/174 |
| 3,736,873 | A | * | 6/1973 | Newman | 101/467 |
| 3,821,931 | A | * | 7/1974 | Yamaji et al. | 101/132 |
| 3,832,948 | A | * | 9/1974 | Barker | 101/453 |
| 3,903,794 | A | * | 9/1975 | Grupe et al. | 101/376 |
| 3,964,389 | A | * | 6/1976 | Peterson | 101/467 |
| 4,005,653 | A | * | 2/1977 | Arkell | 101/389.1 |
| 4,054,094 | A | * | 10/1977 | Caddell et al. | 101/467 |
| 4,060,032 | A | * | 11/1977 | Evans | 101/401.1 |
| 4,114,535 | A | * | 9/1978 | Deshpande | 101/401.1 |
| 4,132,168 | A | * | 1/1979 | Peterson | 101/471 |
| 4,214,249 | A | * | 7/1980 | Kasai et al. | 430/306 |
| 4,347,785 | A | * | 9/1982 | Chase et al. | 101/467 |
| 4,582,777 | A | * | 4/1986 | Fischer et al. | 101/401.1 |
| 4,588,674 | A | * | 5/1986 | Stewart et al. | 430/273.1 |
| 4,729,310 | A | * | 3/1988 | Love, III | 101/466 |
| 4,911,075 | A | * | 3/1990 | Lewis et al. | 101/453 |
| 5,073,791 | A | * | 12/1991 | Mouri et al. | 101/467 |
| 5,094,933 | A | * | 3/1992 | Uhrig | 101/467 |
| 5,109,771 | A | * | 5/1992 | Lewis et al. | 101/467 |
| 5,123,353 | A | * | 6/1992 | Beck | 101/415.1 |
| 5,148,746 | A | * | 9/1992 | Fuller et al. | 101/467 |
| 5,325,776 | A | * | 7/1994 | Rather, Sr. et al. | 101/382.1 |
| 5,544,584 | A | * | 8/1996 | Thompson et al. | 101/375 |

FOREIGN PATENT DOCUMENTS

| | | | | |
|---|---|---|---|---|
| CA | 1050805 | * | 3/1979 | 101/467 |
| GB | 2200323 | * | 8/1988 | |
| JP | 2168 | * | 1/1981 | 101/467 |

OTHER PUBLICATIONS

Research Disclosure 19201, "Method and material for the production of a dry planographic printing plate", Leenders et al., p. 131, Apr. 1980.*

"Direct Method of Producing Waterless Offset Printing Plates by Controlled Laser Beam", Nechiporenko et al., pp. 139–148.*

* cited by examiner

*Primary Examiner*—Stephen R. Funk
(74) *Attorney, Agent, or Firm*—Eitan, Pearl, Latzer & Cohen-Zedek

(57) ABSTRACT

An improved offset printing press has a single plate blanket image (PBI) cylinder for holding an image formed on a thin film printing plate affixed thereto. The plate may be from 0.5 to 25 microns thick and has a thin layer of ink repelling material coated thereon. The plate is imaged, after being affixed to the PBI cylinder, by ablating selective portions of the ink repelling coating. The PBI cylinder is constructed to hold the printing plate by vacuum techniques, and apparatus to load and unload the plate is associated with the PBI cylinder. Because of the thinness of the printing plate, the PBI cylinder is a compliant surface, capable of printing on an inelastic media covered impression cylinder. In addition, unique inking apparatus is provided to transfer ink to the imaged printing plate. Variations of the press include a four color press utilizing a single PBI cylinder.

2 Claims, 5 Drawing Sheets

LASER ABLATABLE WATERLESS LITHOGRAPHIC PRINTING MEMBER

RELATION TO OTHER APPLICATIONS

This invention is a continuation in part of U.S. patent application Ser. No. 07/607,720, Filed Nov. 1, 1990 now abandoned.

BACKGROUND OF THE INVENTION

1. Field of the Invention

This invention relates to printing presses and more particularly, to an improved offset printing press, which includes a combination plate, blanket and imaging cylinder for holding an image formed on a thin film member.

2. Description of the Prior Art

The art of printing has been around since at least 1447 when Gutenberg first printed the bible using moveable type. Since Gutenberg first invented a printing system with movable type, four major developments have occurred to bring the printing industry to its modern place in society. First, the composing machine permitted the mechanical assembly of a page much quicker than Gutenberg and his successors could do by hand. Next, the application of power to printing presses permitted development of the modern high speed, web and sheet fed, multicolor rotary presses. The third significant improvement was the application of photography to printing, first to photo-engraving and later to lithography which simplified prepress operations. The last significant improvement, which is relatively recent, is the application of electronic computers to compose pages to be printed. Computer composition includes automatic word processing and page assembly with graphics and halftones.

The utilization of computer page composition, however, has not been easily transferred to the modern high speed, web and sheet fed, multicolor rotary press. Generally, printing plates for web or sheet fed offset presses are prepared by exposing the photosensitive surface of a printing plate to a source of actinic radiation while the plate is in contact with a film negative. The film negative acts as a stencil, only allowing the plate to receive radiation in the image areas. After exposure, the plate is chemically treated to develop separate ink and water receptive image areas. In modern printing establishments, the film image may be exposed by a laser typesetter, which device transports the film past a rapidly scanned laser beam so as to receive a raster image generated with a computer or derived from an input scanner.

Modern printing processes include (1) relief printing, where the raised surface on a printing plate carries the ink and defines the information to be printed; (2) planographic printing, such as an offset printing press, where the printing surface is essentially flat and the printing plate is chemically treated to be separated into ink receptive (hydrophobic) and water receptive (hydrophilic) image areas; and (3) gravure printing, where an engraved or etched printing plate is used and ink is scraped from the raised surfaces, and only the etched printing plate surfaces result in ink transfer. Printing processes, which are not applicable to this invention, include silk screening, gravure and flexographic relief printing.

The subject invention relates primarily to an improvement in the planographic, or offset, printing process. This process makes use of the fact that certain substances are hydrophobic, that is repel water, such as wax, grease, and certain types of polymers, while other substances are hydrophilic, that is accept water, such as aluminum, zinc, chromium and other metals. In printing, ink is more like a grease and adheres to those areas which have not accepted the water. In its simplest form, the offset process includes preparing an image on a printing plate, where selected areas of the printing plate will hold water, or other dampening solutions, but the image to be printed repels the water and holds the ink. Next, both the image and non-image surfaces are dampened, but the image surface rejects the water. Then, both the image and non-image surfaces are inked, but only the imaged surface holds the ink. Lastly, the ink is transferred to the paper, or other media by direct contact.

In the offset process, the image may be indirectly applied to the media through an intermediate transfer, or blanket cylinder, whereby the image from the plate is applied first to a blanket cylinder and then, from the blanket cylinder to the media. Heretofore, the direct transfer of an image from a plate has been used only sparingly, generally for making lithographic prints, such as of a painting; high speed printing applications all use the offset printing process. To obtain quality print at high speed, it is necessary to have hard surfaces contact soft surfaces in order to accommodate surface irregularities and the intermediate blanket cylinder provides a soft surface between the hard plate and hard media.

Thus, a typical modern offset printing press includes three cylinders, which are the plate cylinder, for holding the imaged printing plate, the blanket cylinder, which is generally a metal cylinder with a blanket, which blanket is a composite of open or closed cell layers for compliance and web layers for dimensional stability, with a compliant surface layer to accept the inked image, and the impression cylinder for carrying the paper, or other media, to be printed. In addition, one or more additional cylinders, may typically be used to guide the paper to the desired position and are referred to generally as the delivery, transfer or transport system. The printing plate is imaged and processed by known techniques, such that the image to be printed holds the ink and repels the water. The printing plate is then affixed to the plate cylinder. The plate cylinder has a pair of additional systems, that is the fountain system and the inking system, for respectively moistening the printing plate and adding the ink to the imaged portion thereof. The ink image is then transferred to the blanket cylinder, and from the blanket cylinder, the ink image is transferred to the media.

One of the problems with offset printing plates is that they are not sufficiently compliant to permit printing a quality image directly on the hard paper media. Thus, as previously noted, an intermediate compliant surface blanket cylinder is required. If one could develop a printing plate which is sufficiently compliant, which at the same time maintains dimensional stability for image registration, so as to permit quality printing, the intermediate blanket cylinder could be eliminated. Such a printing plate could then be mounted to a compliant material on the plate cylinder to provide a compliant surface carrying the ink to directly contact the hard media to be printed. Such a system would not only eliminate the cost of the blanket cylinder, but would additionally reduce the loss of print quality resulting from the double transfer of the image, first to the blanket cylinder and then to the paper.

Another problem in the prior art has been the manner in which the printing plate is imaged. Generally, imaging requires starting with the image to be reproduced, making a negative thereof, and chemically reproducing that image on the printing plate. The process is quite expensive, labor intensive and time consuming. Modern computer systems permit composing entire pages directly on a computer screen, including text, graphical and half tone presentation of information. However, these signals still cannot be provided directly to the printing press; they first must be sent to a composing room to prepare an intermediate film which, in turn, is used to prepare a printing plate. It would be advantageous to permit the signals defining the image to expose a plate directly on the press, previously preloaded with a blank printing plate. Such a direct process of plate preparation would make the step of imaging much less expensive, much quicker and much less prone to distortion due to chemical processing and physical handling of the printing plates, and when used with multiple separation color images, the direct process of plate preparation permits electronic registration to be utilized.

In printing, publications, such as newspapers and magazines, which require a large number of copies and have a fixed format, are printed on high speed rotary web presses. Most publications, however, require less than 10,000 impressions and these short run publications are generally printed on sheet fed presses and duplicators. When color is involved, plate preparation for both types of presses is similar. Plates are prepared separately from the press and are transported to and mounted on the press. These plates must be robust to maintain dimensional stability of the image while handled. If the plates were fixed to the press, forming a composite structure, and then imaged, the plates could be very thin films since they are not transported. Further, a thin film is a compliant member. If instead of fixing the plate to a hard cylinder, a thin film plate were fixed to and imaged on the blanket cylinder, the plate cylinder could be eliminated. With a very thin film plate fixed to its surface, the blanket cylinder retains all of its former compliant attributes. With the plate cylinders removed from a four color press, the press architecture can be re-arranged to combine the function of plate preparation and printing in one system. Further, these functions can be automated so that plate preparation occurs while printing. This arrangement leads to a high productivity, fully automated, on demand printing system.

SUMMARY OF THE INVENTION

In accordance with one aspect of this invention, there is provided a printing system including a cylinder containing a thin film on which is formed an image to be printed and impression means for carrying a media member in contact with the thin film.

BRIEF DESCRIPTION OF THE DRAWINGS

One preferred embodiment of the subject invention is hereafter described, with specific reference being made to the following drawings, in which.

DETAILED DESCRIPTION

Figure 1:
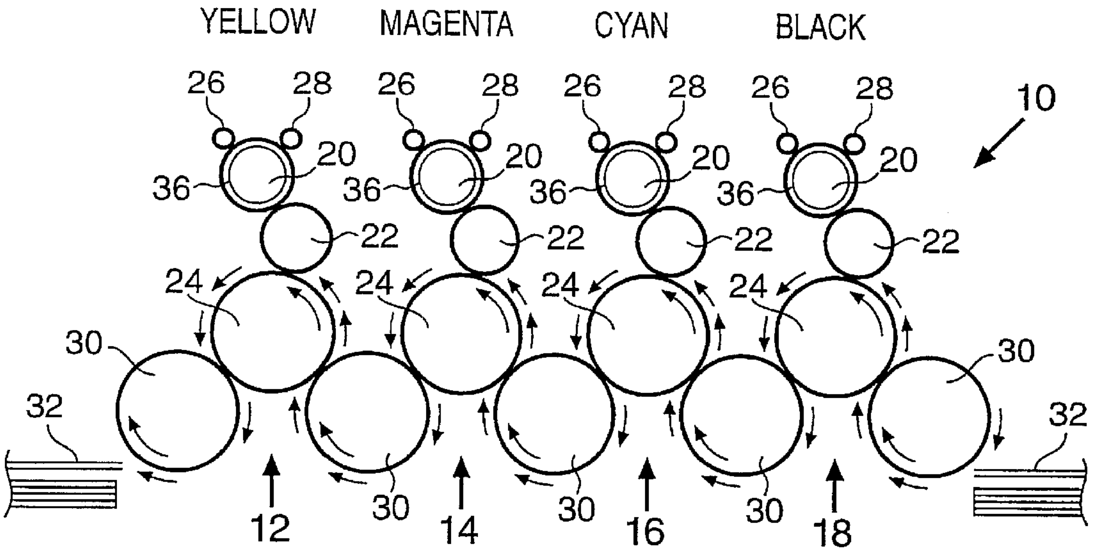
FIG.1 PRIOR ART
FIG. 1 schematically illustrates a typical prior art rotary, high speed, sheet fed four color printing press.

Referring to FIG. 1, a typical prior art four color rotary, sheet fed offset printing press 10 is schematically illustrated. Press 10 includes four stations, or printing couples, 12, 14, 16 and 18, for respectively printing the colors of yellow, magenta, cyan and black. Each of the printing couples 12, 14, 16 and 18 includes three principal cylindrical components, to wit: a plate cylinder 20, a blanket cylinder 22 and an impression cylinder 24, each of which are well known in the off-set, or lithographic, printing art. Associated with plate cylinder 20 are, ink rollers 26 and fountain rollers 28, only one of each being shown for simplicity. A series of transfer cylinders 30 transfers sheets of media 32, such as paper, upon which the printing is to occur, between the blanket cylinder 22 and impression cylinder 24 of each printing couple 12, 14, 16 and 18.

Each of the plate cylinders 20 includes an imaged printing plate 36 which has been imaged by conventional prior art techniques and includes areas which repel water and accept ink and other areas which accept water. For example, a modern offset printing plate may be a thin aluminum sheet covered with a light sensitive photo-polymer coating. The light sensitive coating is exposed in a separate exposure system by light through a negative of the image to be printed and the unexposed polymer is washed away exposing the aluminum base. This then forms the imaged printing plate 36.

Thereafter, imaged printing plate 36 is attached to plate cylinder 20 in a known manner and ink from inking roller 26 is transferred to printing plate 36, such that the ink adheres to the polymer covering the unexposed aluminum and is repelled by water on the exposed aluminum. This ink image is transferred (hence, "offset"), as a mirror image version thereof, to blanket cylinder 22, and from blanket cylinder 22, the ink image is transferred to paper 32 as it is fed between the rotating blanket cylinder 22 and impression cylinder 24. It should be noted that the position of paper 32 must be registered so as to properly receive the image from blanket cylinder 22. In a color printing system, as shown in FIG. 1, the above is repeated for each of the four printing couples 12, 14, 16 and 18. In addition, image registration must be maintained between each printing couple 12, 14, 16 and 18.

Figure 2:
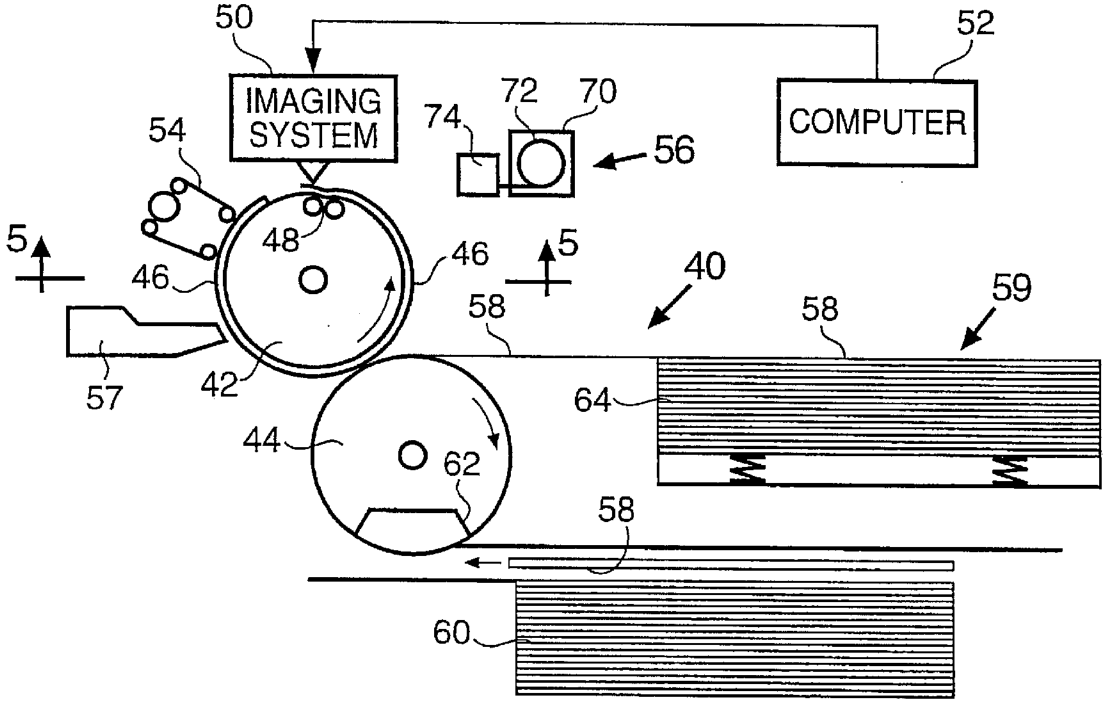
FIG. 2 schematically illustrates the improved printing press of the subject invention in its most basic form.

Referring to FIG. 2, a schematic illustration of a printing press 40 utilizing the concepts of the subject invention is shown. Printing press 40 includes a plate blanket image (PBI) cylinder 42 which combines the functions of the plate cylinder 20 and blanket cylinder 22 of the prior art printing press 10, shown in FIG. 1. In addition, printing press 40 includes an impression cylinder 44, similar to the prior art impression cylinder 24 shown in FIG. 1. The principal difference between the PBI cylinder 42 and the apparatus of prior art is the form of the printing plate 46.

As noted above, for quality printing to result, it is necessary to impress a compliant surface and a hard surface against one another. Since a prior art printing plate was a hard surface, a blanket cylinder having a compliant surface was necessary to permit quality printing. Printing plate 46, on the other hand, is fabricated from a thin film so as to function as a compliant surface, in that it is able to accommodate both the micro and macro variations typically associated with the paper carried by impression cylinder 44. The exact manner of constructing printing plate 46 will be described hereafter with respect to FIG. 3.

Printing plate 46 is held on PBI cylinder 42 by a pneumatic clamp 48 for holding the leading edge of printing plate 46, with the body of printing plate 46 being held on PBI cylinder 42 by a vacuum. The details of attaching printing plate 46 is shown in more detail in FIGS. 4 and 5. After a blank printing plate 46 is installed, as will be hereafter described, it is imaged by an imaging system 50, also described hereafter with respect to FIG. 6. Imaging system may be connected to receive signals from an input scanner or a computer 52, such as an Apple MacIntosh personal computer, a standard page composition computer or an engineering work station, which generates character, graphical, or halftone images to be printed. Computer 52 may be connected to imaging system 50 in the same manner as any computer would be connected to a conventional laser printer, for example, and imaging system 50 may include a buffer memory.

Figure 7:
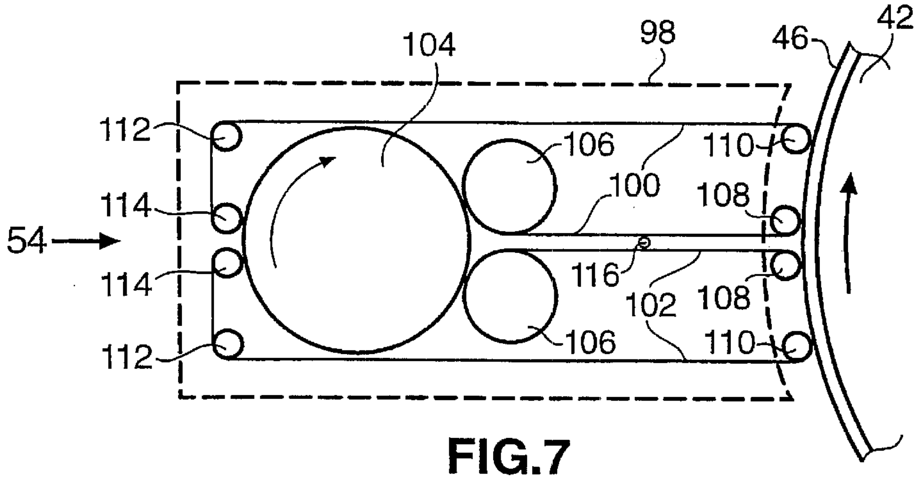
FIG. 7 illustrates the inking system of the press shown in FIG. 2.

Also included with press 40 is an inking system 54, described hereafter in more detail with respect to FIG. 7, and a blank printing plate feeding system 56 and plate removal system 57, both described hereafter in more detail. A stack of blank media, such as paper sheets 58, may be fed from a press feeding system 59, shown schematically as a tray 64 containing a stack of paper sheets 58. Each sheet 58 is fed between PBI cylinder 42 and impression cylinder 44 by being attached to a gripper 62 included on impression cylinder 44. As with any printing press, each sheet 58 of paper must be properly indexed and registered with respect to the inked printing plate 46 on PBI cylinder 42 as it enters the space between PBI cylinder 42 and impression cylinder 44. After printing, the printed sheet 58 is further transferred away from impression cylinder 44 to be stored in a stacking tray 60. The manner of feeding and indexing the sheets of paper 58 is conventional in the art of printing and is not being described in detail herein. Alternatively, a continuous roll of paper may be used and appropriate paper cutting apparatus may be provided.

Figure 3:
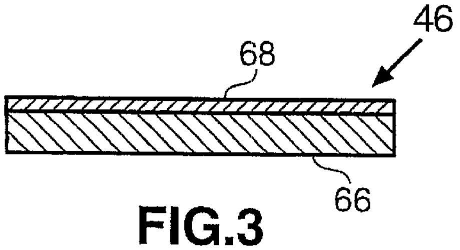
FIG. 3 illustrates a cross-sectional view of the printing plate used with the press shown in FIG. 2.

Referring now to FIG. 3, a cross-sectional view of printing plate 46 is shown. Printing plate 46, may be constructed by forming an ink releasing material layer, such as metal 68, over an ink receiving material base 66. As used herein, an “ink releasing” material is a material to which ink does not adhere because of its inherent surface energy when it has been wetted by a fountain system or to which an emulsified ink does not adhere, and an “ink receiving” material is a material to which the wetting agent of a fountain system, such as water, does not adhere, thereby allowing ink to adhere thereto. Base 66 may be a cast film, such as a polycarbonate material, which accepts ink. Films of this material are commercially available as thin as one half a micron; for example commercially available polycarbonate films manufactured and sold by Capfilm, Lee, Mass., may be used.

To make a traditional lithographic printing plate, layer 68 may be aluminum, zinc or other metal which accepts water, that, in turn, prevents the ink from adhering thereto. Alternatively, a driographic printing plate, which does not require a fountain system for inking, may be used and for this type of printing plate, and in such a plate, layer 68 may be a silicone ink releasing material, available from Dow Chemical of Midland, Mich. As will be explained hereafter, printing plate 46 is imaged by ablating selective portions of layer 68. Because some coatings which may be used for layer 68 are transparent to laser radiation, it may be desirable to incorporate an absorber therein in order to better capture and utilize the laser radiation energy. While printing plate 46 has been described above with respect to an ink receiving material base 66 covered by an ink releasing material layer 68, the opposite may be used and the image made in reverse.

In order to form printing plate 46 as a compliant surface (for printing purposes) when affixed to PBI cylinder 42, it must be extremely thin so as to accommodate the micro and macro imperfections associated with the press structure and the media being printed, such as paper sheets 58, or the impression cylinder 24. Thus, the thickness of base 66 should be between 0.5 and 25.0 microns and the thickness of layer 68 should be between 100 to 1500 Angstroms. In determining the thickness of film base 66, manufacturing and handling criteria must be considered. Films manufactured by extrusion techniques may be fabricated as thin as 25 microns and can thereafter be stretched to decrease the thickness as little as 10 microns. Other techniques, such as creating the film by a casting technique, permit the films as thin as 0.5 microns and as thick as 12 microns. In handling, the thicker and stronger the film, the easier the handling. On balance, a film of between 15 and 20 microns appears to be best suited for use in press 40 for handling purposes, although one would desire to use as thin a film as possible from a cost point of view, as the cost of film base 66 is normally based upon weight, which is directly related to thickness.

In contrast, a traditional offset printing lithographic printing plate may have a base approximately 0.1 to 0.3 millimeters thick, that is, ten to many hundred times as thick as printing plate 46. Further, the traditional prior art printing plate has a coating to be imaged, developed and cleaned to define the images to be printed and this coating is approximately the same thickness as printing plate 46. It is the thinness of printing plate 46, relative to printing plates heretofore utilized, together with the construction of PBI cylinder 42, described hereafter with respect to FIGS. 4 and 5, that permits the compliant characteristic of PBI cylinder 42, and thus, permits the combining of the functions of the plate and blanket cylinders of the prior art.

The prior art techniques of printing plate fabrication included fabricating the printing plate at one location and then physically moving the printing plate and attaching it to the plate cylinder. After printing was completed, the printing plate was removed from the plate cylinder and again moved to a storage or disposal location. In addition because the cost of plate making was high, the prior art techniques for plate fabrication had goals of making printing plates which could print a large quantity of copies, such as many thousands and sometimes as many as a million copies. Because of the necessity of physically handling the printing plates and the philosophy of fabricating printing plates capable of long print runs, the prior art printing plates, of necessity, are relatively thick, and thus are not compliant. However, most printing applications call for short runs of a relatively small number of printed copies, such as between a hundred and several thousand. Thus, the durability of most prior art printing plates was much greater than really needed for most printing applications, although it was needed due to the handling and the requirement to maintain dimensional stability for registration.

In press 40, a different printing plate philosophy is utilized. Instead of making durable noncompliant, or hard, printing plates, which permit long runs and which can be handled in the normal course of printing, the ultra-thin compliant printing plate 46 is utilized. First, printing plate 46 is capable of printing only several thousand, up to ten thousand or so, copies and second, all physical handling of printing plate 46 is eliminated. With the handling constraint eliminated in press 40, printing plate 46 may be made ultra-thin, and hence compliant relative to the micro and macro variations found in the press structure and paper sheets 58 being printed.

Because of the ultra-thinness of printing plate 46, extreme care must be utilized in handling printing plate 46. Thus, the manner of imaging printing plate 46 and loading blank printing plate 46 on PBI cylinder 42 becomes critical. Both loading and imaging are accomplished directly within press 40, thereby eliminating the manual transport of imaged printing plate 46 as is typified by the prior art. Coated films, as described above for printing plate 46, may be commercially fabricated by existing state of the art techniques and the final product can be shipped in rolls. Because of the thinness of printing plate 46, the length of the covered film in each roll may be quite large, such as 500 to 5,000 feet per roll. It should be noted that because the thickness of the blank material used to fabricate printing plate 46 is as much as one hundredth the thickness of currently used blank printing plate materials, the weight and bulk is correspondingly less, thereby significantly reducing the cost of the material per printing plate. Furthermore, the weight, and hence shipping and disposal cost per printing plate and the storage cost of blank printing plate materials are also significantly reduced.

Figure 4:
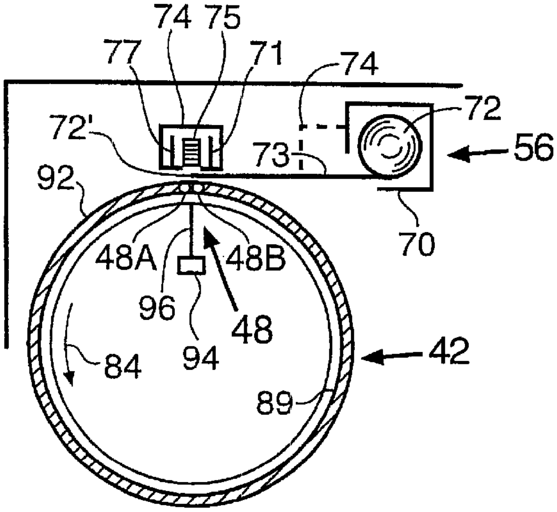
FIG. 4 further illustrates the construction of the PBI cylinder and the plate material insertion apparatus.

Referring again to FIG. 2 and, in addition, to FIG. 4, plate feeding system 56 includes a container 70 for containing a roll of blank printing plate material 72, fabricated as described above. In the home position, the leading edge 72' of the printing plate material 72 is attached beneath a vacuum transport bar 75 within a housing 74 (shown in the home position in dashed line in FIG. 4) and rests on a platform 73 of container 70. To attach a blank printing plate on PBI cylinder 42, vacuum transport bar 75 picks up the leading edge 72' of blank plate material 72 without introducing wrinkles and housing 74 is moved to the eliminate any wrinkles, platform 73 may include a de-wrinkle bar (not shown) at the exit from container 70, such as a crowned thin walled cylinder, and bustle rolls, such as drag rollers oriented with their axis of rotation at an angle to the direction of movement of the blank printing plate material 72, to provide lateral tension to the blank printing plate material 72.

The vacuum transport bar 75 carries the leading edge 72' of the blank printing plate material 72 to a position above grippers 48 on stationary PBI cylinder 42 and an insertion bar 71, included in housing 74, tucks blank plate material 72, from a position slightly remote from leading edge 72', between the two pneumatic tubes 48A and 48B of gripper 48, so as to be mechanically retained on PBI cylinder 42. During this insertion, the tubes 48A and 48B may be deflated to provide space for inserting blank plate material 72 and insertion bar 71. Thereafter, the tubes 48A and 48B are re-inflated to firmly hold the inserted blank plate material 72 as the insertion bar 71 is removed.

PBI cylinder 42 then rotates in the direction shown by the arrows to receive the additional blank printing plate material

Figure 5:
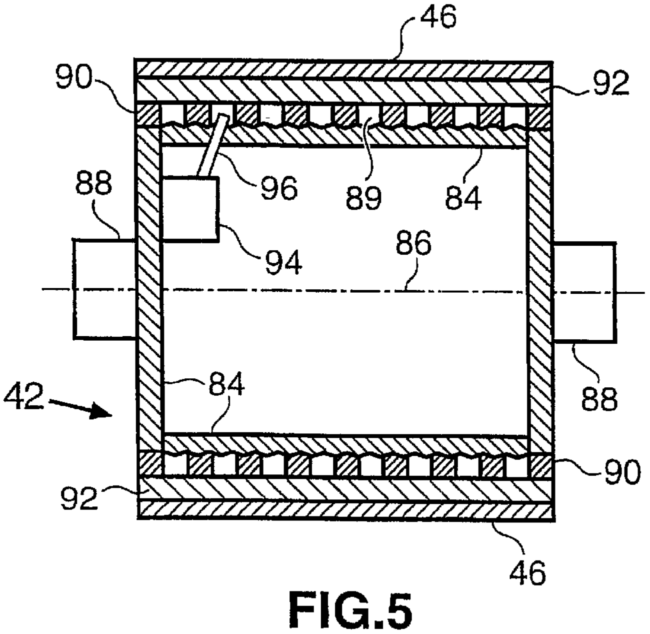
FIG. 5 illustrates the construction of the plate blanket image (PBI) cylinder of the press shown in FIG. 2.

72 and the received blank printing plate material 72 is held on PBI cylinder 42 by a vacuum on the surface thereof, as described hereafter with respect to FIG. 5. After substantially one complete revolution of PBI cylinder 42, cutter 77, also included in housing 74, cuts blank plate material 72. Cutter 77 may be a hot wire, or a knife. The housing 74 is then returned to the home position on platform 73 and the cut blank plate material 72 is retained on PBI cylinder 42 by vacuum, ready for imaging as printing plate 46. A constant torque system (not shown) is utilized with the thin film supply roll to maintain tension in film 72 whenever film 72 is transferred. This arrangement provides the apparatus to rewind film 72 when the vacuum transport bar 75 returns to the home position on platform 73.

Referring now to FIG. 5, which is a cross-sectional view of PBI cylinder 42 taken across lines 5—5 of FIG. 2 and further referring to FIG. 4, which is a view of PBI cylinder 42 and plate feeding system 56. As just described, printing plate 46 is held firmly attached to PBI cylinder 42 during imaging and printing by a pneumatic clamp 48 and a vacuum over the remainder of the surface thereof. The base of PBI cylinder 42 is a hollow cylinder 84 which rotates about axis 86 through bearing hubs 88. It is not desirable to evacuate the entire hollow center of base cylinder 84 in order to hold printing plate 46 attached to PBI cylinder 42 because, first, it would require a larger vacuum pump than is needed for a fast evacuation of the cylinder 84, and more importantly, evacuation of the entire volume within base cylinder 84 would distort the cylindrical surface due to the large external forces.

In order to avoid the above problem, the vacuum is limited to the small volume immediately below the curved outer surface of PBI cylinder 42. This is accomplished by etching the curved outer surface of base cylinder 84 to form a plenum chamber 89 and then placing a metal perforated plate 90 over the etched surface. The etched surface of base cylinder 84 permits air flow between the openings of perforated plate 90. Lastly, a porous compliant blanket 92 capable of permitting gas flow therethrough, such as a reinforced open cell elastomer material, is placed over the perforated plate 90. A venturi vacuum pump 94 is placed within the open interior space of base cylinder 84 and connected through piping 96 to evacuate the space between the etched surface of base cylinder 84 and blanket 92. Pump 94 may be fed from an air coupling coaxial with the bearings of hub 88. Printing plate 46 is then placed over perforated plate 90 and held firmly in place by the vacuum presented through blanket 92. The force resulting from the evacuation of plenum chamber 89 is sufficient to hold plate 46 firmly against blanket 92, such that the combination of plate 46 and blanket 92 operate as an integral compliant surface for printing purposes, thereby permitting printing by direct contact of the inked image on plate 46 against the hard surface paper 58. The structure described above for PBI cylinder 42 eliminates the potential surface distortion which would occur if the entire interior space of base cylinder 84 were evacuated and, in addition, permits a small vacuum pump to be used which fits within base cylinder 84, thereby eliminating the need for a vacuum coupling into the interior of base cylinder 84.

Figure 6:
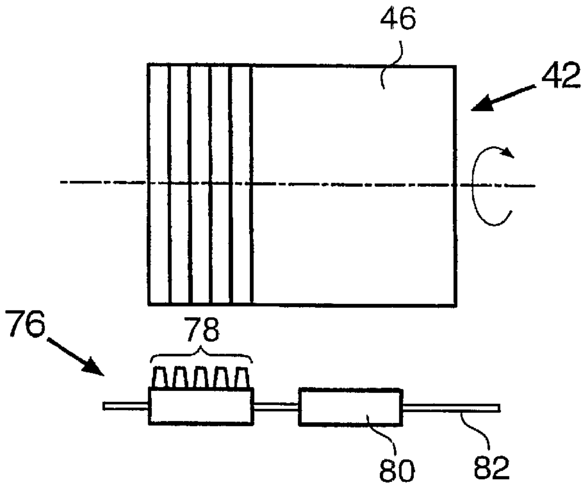
FIG. 6 schematically illustrates the printing plate imaging system of the press shown in FIG. 2.

Referring now to FIG. 6, the manner of imaging the attached blank printing plate 72 to form the imaged printing plate 46 will now be described. As previously described, blank printing plate material 72 includes an extremely thin layer (100 to 1500 Angstroms) of metal or an ink repellant silicone, or other similar ink repellant, material 68 over an ink accepting thin (0.5 to 25.0 microns) polycarbonate or similar material film base 66. The image to be printed is formed by removing the coating 68 from the film 66 wherever ink is to appear. This is accomplished by scanning a laser beam over those areas of the blank printing plate 46 where the coating material 68 is to be removed. As long as the power of the laser beam is above the ablation threshold of the layer of coating material 68, the coating 68 is ablated. Imaging system 50 is designed to accept data from a data input source, such as computer 52, in the form of raster and page template data and then convert that data to signals modulating the laser beam generator included therein as the printing plate 46 being imaged is rotated on PBI cylinder 42.

In designing the imaging system 50, the desired resolution of pixels on the printing plate 46 must be considered. For commercial quality printing, the resolution should be in excess of 1000 dots per inch and may be selected to be 3600, or more, dots per inch for high quality color printing. To produce a broadsheet image of, for example twenty by twenty-four inches, in a reasonable time of, for example, two minutes, at 2000 dots per inch with a single laser beam, the PBI cylinder would have to rotate at a velocity of approximately 20,000 revolutions per minute. Clearly, this is not acceptable. Thus, either the time must be increased, the resolution reduced, or multiple laser beams utilized. For example, if an array of sixty-four laser beams is utilized, the velocity of PBI cylinder 42 during imaging may be reduced to 312.5 revolutions per minute, an acceptable goal.

In FIG. 6, an array 76 of laser beam generators 78 is provided. Array 76 may be made from a single beam with appropriate beam splitters and individual modulators, or from a plurality of laser diodes coupled to fiber optic cables properly positioned. Preferably, however, array 76 may be a laser diode array, which may be fitted with an array of micro lenses, and each beam generator 78 will be the individual laser diodes of the laser diode array. As PBI cylinder 42 rotates and carries the printing plate 46 being imaged therewith, the beam from each diode 78 will be either on or off. It should be understood that, as used herein, when a beam is termed "on", the beam provides radiation with sufficient power to ablate the coating 68 on the printing plate film base 66 and when a beam is termed "off", the beam provides radiation with insufficient power to ablate the coating 68 on the printing plate film base 66.

Since array 76 only includes a finite number of laser diodes 78, it can only image a small swath of scan lines during each revolution of PBI cylinder 42. Thus, to image the entire printing plate 46, array 76 must be precisely incremented across the length of the printing plate 46 on PBI cylinder 42. This is accomplished by utilizing a peristaltic mechanism arrangement, in which a reference mass 80 and array 76 both ride on air bearings over a rail 82. During the time the array of laser diodes 78 is imaging a swath along printing plate 46, reference mass 80 is being precisely moved to the next position. Then, during the short time from the end of printing plate 46 to the beginning of printing plate 46 at gripper 48, as seen in FIG. 2, array 76 is quickly moved against reference mass 80. Reference is made to U.S. Pat. No. 4,764,815 in the name of Robert M. Landsman, the inventor hereof and entitled, "Array Scanning System with Movable Platen", which shows a similar peristaltic movement system in a scanning printer plate imaging system.

Structure which can accomplish the precise movements required for mass 80 is well known from semiconductor lithography systems, where movements precise to hundredths of a micron are required. For example, see U.S. Pat. No. 4,870,668 in the name of Robert D. Frankel et al entitled Gap Sensing/Adjustment Apparatus And Method For A Lithography Machine, where an interferometer and precision stepper motors are utilized to move a lithography stage to a given position at a precision of 0.02 microns. Precision to this degree is not required and blind stepping of reference mass 80 over rail 82 may be accomplished using a precision linear d.c. motor. More specifically, air bearings are placed between array 76 and rail 82 and mass 80 and rail 82. When vacuum is applied to the air bearing, the array 76 or mass 80 is held firmly against rail 82 and when pressure is provided to the air bearing, array 76 or mass 80 float freely over rail 82 with essentially no friction. Linear d.c. motors, particularly if servo systems are included therewith, can then move the array 76 or mass 80 to the precise position desired.

In utilizing array 76, care must be taken to control the gap between the diodes 78 of array 76 and the surface being imaged on PBI cylinder 42, particularly if a common optical lens system is used between array 76 and the surface of PBI cylinder 42 as would be typical of the prior art. Without gap control, the focal spot, pixel to pixel center spacing and overall length of the array image will vary in proportion to the gap distance. Such gap control may be accomplished with known air gauge or capacitive sensors. However, if the common lens can be omitted between array 76 and the surface of PBI cylinder 42, gap control becomes less important, since the pixel to pixel spacing will remain constant and optical efficiency is improved. Thus, a gap variation will only result in the pixel size varying, and considerable leeway is permitted in pixel size, although not in pixel to pixel spacing. Thus, if array 76 includes a micro-lens for each element 78 or if array 76 is a bundle of fiber optic cables, the intermediate lens becomes unnecessary.

In a more general sense, when a multi-element imaging device is used to expose or tool an image, the final image is constructed of a number of swaths laid down by the array. It is mandatory to control both the length of the array image and distance the array is incremented or an overlap or space between the swaths laid down by the array will result. In the past, an optical system has been used to transfer energy from the array to the imaged surface, with the result that the size of the imaged pixels and the center to center distance between the pixels vary based upon the array dimensions, the focal length of the lens and the distance of the lens to both the object and image planes. Since array length and focal are physical properties, they can be controlled to closed tolerances during manufacture; hence the distance between the array and object being imaged remains the variable parameter and this distance must be precisely controlled.

If the optical system can be eliminated, a greater tolerance in the array to object distance will be permitted. Existing technology permits the fabrication of a laser diode array on the surface of a base, where the individual diodes emit circular beams of collimated light with sufficient power to ablate layer 68 without the necessity of an intermediate lens. Such technology is described in a paper by J. L. Jewell, et al, entitled "Surface-emitting Microlacer For Photonic Switching And Interchip Connections", Proc. SPIE, Vol. 29, No. 3, Pages 120–215 (1990). In using the Jewell et al technology, individual surface emitting diodes can be fabricated at precise center to center positions and with a precise diameter. Each beam, then expands only slightly with distance from the array, but the center to center distance between each beam remains constant. Hence, much less control of the array to image plane on the object is required. The distance of the array to the image plane can be maintained by a servo system with an air gauge, capacitive sensor or similar sensor.

The following example illustrates the application of these principles. Consider a system with a resolution of 2400 dots per inch operation at a wavelength of 0.78 microns. For complete coverage, the center to center distance of the pixels in the image plane should be 10.58 microns, while the diameter of each pixel should be the square root of two times the diameter, or 14.97 microns. A laser diode array with a circular laser profile and an exit diameter of 10 microns with a zero order mode structure will project a 14.97 micron pixel when held 112.17 microns from the image plane. The pixel size D at a distance Z from the laser generator providing a laser beam at a wavelength d with a diameter Do, is given by the expression:

$$D = \sqrt{Do^2} + \frac{(4 \cdot d \cdot z)^2}{(\pi \cdot Do)}$$

If the array to object distance changes by as much as ten percent from the nominal 112.17 microns distance, the pixel size changes only slightly while the center to center distance and the overall swath width of the image does not change. For example, a 10% decrease in the array to object distance results in a decrease in the pixel size to 14.16 microns and an increase by 10% in the array to object distance results in a increase in the pixel size to 15.82 microns.

Referring again to FIG. 2, once the printing plate 46 is attached to PBI cylinder 42, and the imaging thereof has been completed, press 40 is ready to begin printing. This is accomplished by applying ink to printing plate 46 using inking system 54 and passing paper sheets 58 between PBI cylinder 42 and impression cylinder 44. Care must be taken to align the leading edge of sheet 58 with the leading edge of printing plate 46 so that the printing is properly registered on the sheet 58.

Ink system 54 includes a replaceable cartridge 98, shown schematically in detail in FIG. 7. Since PBI cylinder 42 and integral printing plate 46 are considerd soft for printing purposes, the ink distribution system 54 contacting the printing plate 46 may be hard. Thus, throw-away hard (for printing purposes) belts 100 and 102 are used to distribute the ink. The hard belts 100 and 102 are positioned to enhance dwell time of ink at the nip, that is where the belts 100 and 102 contact the surface of printing plate 46 or the surface of porous ink roll 104. In addition, the hard belts 100 and 102 minimize heat build up and assure complete coverage of printing plate 46. When the ink is depleted from ink roll 104, the cartridge 98, including belts 100 and 102 and ink roll 104, are replaced.

Each of the belts 100 and 102 may be fabricated of a polyester, or other similar material, in a closed loop form. Each of the belts 100 and 102 is guided by a set of rollers 106, 108, 110, 112 and 114 so to be in contact with both the ink roller 104 and printing plate 46. Rollers 106 may be the drive rollers and drive the belts 100 and 102 at a slight differential velocity than ink roller 104 is driven by its drive mechanism (not shown) in order to aid ink distribution. Ink density on the belts 100 and 102 is also controlled by adjusting the air pressure inside the porous ink roll 104. A feedback servo system may be utilized to monitor and control the ink density in order to control transfer of the ink film to belts 100 and 102. Such servo system would include measuring the optical density of the belts 100 and 102 and comparing the measured density against a reference.

In addition, ink rollers 104 may be made to laterally oscillate to aid in ink distribution from ink roller to belts 100 and 102. A roller 116 is provided between belts 100 and 102 at a skewed position relative to the direction of travel of belts 100 and 102 in order to laterally distribute the ink in the belts 100 and 102. The position of the guide rollers is selected to optimize the contact angle between belts 100 and 102 and both ink roller 104 and printing plate 46. This contact angle is important in determining the dwell time for the ink layer to split from one surface to the other. Generally, the longer the dwell time, the less the energy required to split the ink; thus in the prior art, large diameter inking rollers were used for inking, to optimize ink distribution. In inking system 54, the length of belt 100 and 102 and control of the contact angle substitutes for large rollers of the prior art. In addition, the tortuous path of the belts 100 and 102 minimizes evaporation and ink drying.

In addition to using pressure to enhance ink flow from ink roller 104 to belts 100 and 102, vacuum may be applied to the ink roll 104 to aid in controlling ink film thickness on the belts 100 and 102 when press 40 is not being used for extended periods of time.

The controlled environment of press 40 encourages the use of emulsified inks. Emulsified inks, when used with lithographic printing plates, eliminate the need for a dampening system. These inks have not enjoyed widespread application with traditional open press designs. The uncontrolled environment of these presses allows water and solvent evaporation leading to inconsistent performance. Emulsified inks are available from Spinks Dryco, of Sarasota, Fla.

If press 40 is to be used in an office environment, the use of ultraviolet inks can end certain problems associated with solvent evaporation. The use of ultraviolet ink can also reduce the dwell time needed to dry the ink before application of the next impression and can also eliminate the need for powders sprayed between sheets to aid drying of the ink on the printed sheets. In the past, an intermediate transfer cylinder provided the dwell time for ink to dry between impressions. Thus, the use of ultraviolet inks simplifies press design, eliminating the need for spray powders and intermediate transfer cylinders, which in turn improves registration, lowers costs and allows higher press speeds.

Cleaning a traditional offset press involves printing plate removal, cleaning the ink distribution system, washing the blanket cylinder and disposal of wastes. In press 40, the thin film printing plate 46 is simply vacuumed from the surface of PBI cylinder 42 by plate removal system 57, thereby further eliminating physical handling of printing plate 46, as well as washing the prior art blanket cylinder. The plate removal system 57 may contain a shredder to destroy the printing plate image for security purposes. The vacuum in plate removal system 57 may also be used to remove the ablated material during the imaging procedures.

Up to this point, the basic design of press 40 for printing a single side with a single color has been described. However, the concepts contained in press 40 can be extended to construct more elaborate printing presses for more complex printing, such as color printing or printing on both sides of a sheet, as well as permitting higher productivity. Various additional press configurations are hereafter described in FIGS. 8 through 11.

Figure 8:
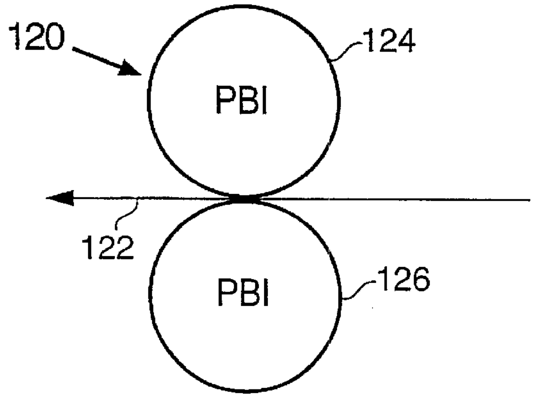
FIG. 8 illustrates a printing system utilizing the subject invention in which both sides of a paper may be printed.

FIG. 8 schematically shows a press 120 capable of printing on both sides of a sheet of paper. The paper follows the path 122, which may be either single sheet feed system or a web feed system. Press 120 includes upper and lower PBI cylinders 124 and 126. As seen in FIG. 8, PBI cylinders 124 and 126 are arranged to print on both sides of the hard paper. Since the paper is considered a hard surface for printing purposes, each PBI cylinder 124 and 126 can function as the impression cylinder for the other PBI cylinder 124 and 126. While not shown, each of the PBI cylinders

124 and 126 includes systems corresponding to imaging system 50, inking system 54, plate feeding system 56 and plate removal system 57 shown in FIG. 2. Preferably, emulsified inks or ultraviolet cured, such as ultraviolet cured inks or a driographic plate surface should be used in press 120 to avoid the need for a fountain system. For industrial applications, a fountain system is not precluded when the integrated press is used with traditional inks.

Figure 9:
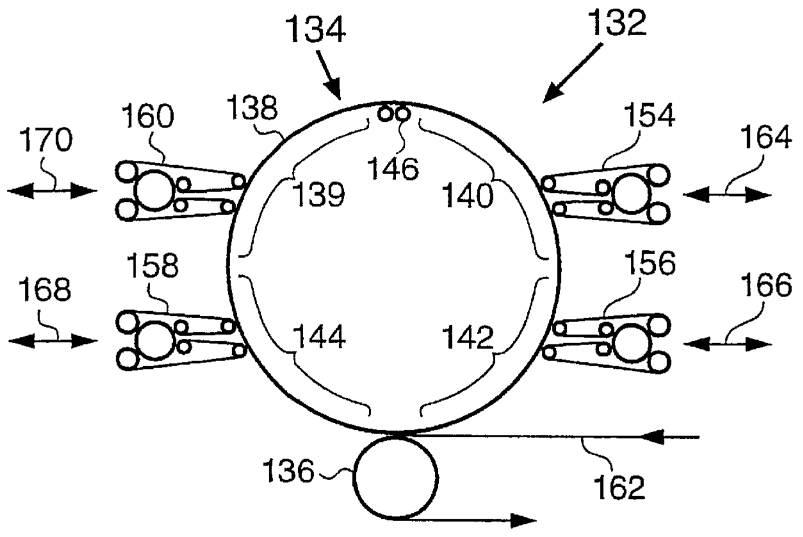
FIG. 9 illustrates a printing system utilizing the subject invention in which four color printing may occur.

FIG. 9 shows a four color press 132 using a single PBI cylinder 134 capable of printing the four different colors and a single impression cylinder 136. It should be understood that the systems corresponding to imaging system 50, plate feeding system 56 and plate removal system 57 shown in FIG. 2 are included with PBI cylinder 134, but are not shown in FIG. 9 for simplicity. PBI cylinder 134 differs from PBI cylinder 42 in FIG. 2 in that it has a circumference at least four times as great and it has a single printing plate 138 with four color separation images 139, 140, 142 and 144 affixed thereto. A single pneumatic gripper 146 holds plate 138 in the same manner as gripper 48 shown in FIGS. 2 and 4. Each of the four printing color separation images 139, 140, 142 and 144 is imaged similar to printing plate 46 described with respect to FIGS. 2 and 6 and for one of the four colors, yellow, magenta, cyan and black, used with a traditional four color press. Further, each of the color separation images 139, 140, 142 and 144 is positioned on PBI cylinder 134 in a particular quadrant thereon so as not to overlap one another.

In addition, there are four inking systems 154, 156, 158 and 160 positioned around PBI cylinder 134, one each for the four colors yellow, magenta, cyan and black. Because each of the inking systems 154, 156, 158 and 160 is to be used to ink only one of the color separation images 139, 140, 142 and 144, mechanisms (indicated by arrows 164, 166, 168 and 170) are associated therewith to move the inking systems against the appropriate printing plate as it passes the inking system and away from the other printing plates as they pass. Impression cylinder 136 may be similar to impression cylinder 44 described in FIG. 2, except that the paper received from paper path 162 travels around impression cylinder 136 four times for each revolution of PBI cylinder 134 so as to permit printing by each of the four color separation images 139, 140, 142 and 144.

In the four color press 132 of FIG. 9, inking system 154, 156, 158 and 160 should preferably utilize a quick drying ink, such as an ultraviolet cured ink, since conventional inks with a fountain system or emulsified inks require time for ink to dry before receiving the next impression.

The size of PBI cylinder 134 will depend upon the size of the image being printed. For example, if PBI cylinder 134 is thirty-nine inches wide and has a diameter of thirty-nine inches, it can carry the images of four twenty-five inch by thirty-eight inch printing plates commonly used for commercial color printing. Alternatively, by making PBI cylinder 134 eighteen inches wide and with a diameter of twenty-two inches, double sheets of letter, legal or A4 size paper may be printed in color.

Figure 10:
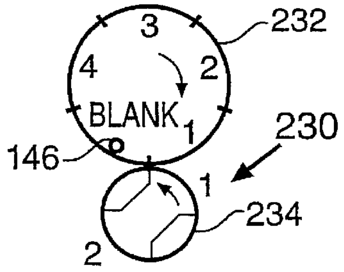
FIG. 10 illustrates an alternate version of a press for printing with four colors.

Referring now to FIG. 10, an alternate version of a four color press 130, having a PBI cylinder 232 and an impression cylinder 234. PBI cylinder 232 differs from PBI cylinder 134 shown in FIG. 9 in that it is sized to accommodate five images instead of four and impression cylinder 234 differs from impression cylinder 136 in FIG. 9 in that it is sized to accommodate two sheets of paper, labeled 1 and 2. Four of the five image areas, labeled 1–4, are imaged with the four color separation images previously described and the fifth image area, labeled "blank", is left blank, that is, it is left un-imaged so as not to print anything. Additionally, the gripper 146 may be included in the blank area. First, sheet 1 on impression cylinder 234 is printed upon by image 1 on PBI cylinder 232 and then sheet 2 is printed upon by image 2. Next, sheet 1 is printed upon by image 3, sheet 2 is printed upon by image 4 and sheet 1 passes, but is not printed by, the blank area. On the next revolution of PBI cylinder 232, sheet 1 is printed by imaged areas 2 and 4 and sheet 2 is printed by imaged areas 1 and 3. Thus, after two revolutions of PBI cylinder 232 and five revolutions of impression cylinder 234, two sheets are printed in four colors. The advantage of press 230 over press 132 is that additional time is available for the ink to dry on the sheets carried by impression cylinder 234 during each half revolution of impression cylinder 234 when no printing occurs.

One of the problems with the press 40 shown in FIG. 2 is the additional time required for loading and imaging the printing plate 46 and removing the printing plate 46 after use. During this time, no printing can occur. In certain instances, this may account for as much time as the actual printing, particularly in situations where short runs of 500 or so sheets are to be printed. In order to make more productive usage of the press, the systems shown in FIGS. 9 and 10 have two or more PBI cylinders to permit the maintenance and imaging of one PBI cylinder to occur while another PBI cylinder is printing. Then, the cylinders are switched.

Figure 11:
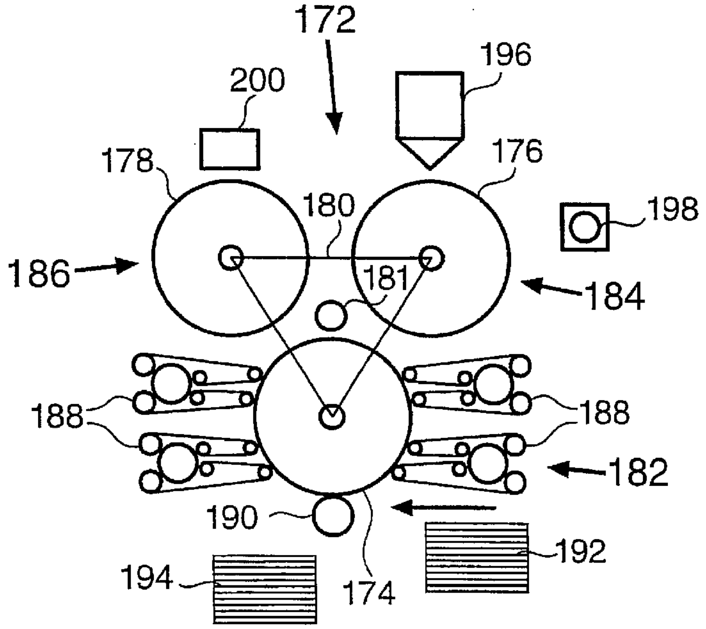
FIG. 11 illustrates a four color short run printing press system utilizing three plate blanket image cylinders arranged in a pipeline fashion.

Specifically referring to FIG. 11, an automated, short run, self cleaning, color press 172 is shown having three PBI cylinders 174, 176 and 178 arranged in a pipeline architecture. Specifically, each of the three PBI cylinders 174, 176 and 178 is mounted on one apex of a triangular turret 180, which rotates about a center 181. As seen in FIG. 11, PBI cylinder 174 is positioned at a printing station 182, PBI cylinder 176 is positioned at a cleaning station 184 and PBI cylinder 178 is positioned at an imaging station 186. Printing station 182 also includes four inking systems 188 and an impression cylinder 190, a tray 192 of blank paper sheets and a tray 194 for printed paper sheets, together with the necessary paper transport mechanism for transporting the paper from tray 192 to the nip between impression cylinder 190 and PBI1 cylinder 174 then at printing station 182, and thereafter for transporting the printed paper to tray 194.

Cleaning station 184 includes the plate removal system 196 and plate feeding system 198 similar to systems 56 and 57 described above with respect to FIG. 2. At cleaning station 184, the old printing plate is removed and a new blank printing plate is affixed to the PBI cylinder 176. Imaging station 186 includes the laser imaging system 200, which is similar to imaging system 50 described above with respect to FIG. 2.

Turret 180 is operated after retraction of the inking systems 188 and after the completion of the printing, cleaning and imaging tasks are complete to rotate one hundred and twenty degrees counter-clockwise. After each operation of turret 180, a new PBI cylinder, with newly imaged printing plate, is positioned at printing station 182, ready for printing, a PBI cylinder with a used printing plate is positioned at cleaning station 184, ready for removal and replacement, and a new blank printing plate is positioned on the PBI cylinder located at imaging station 186 ready for imaging.

Figure 12:
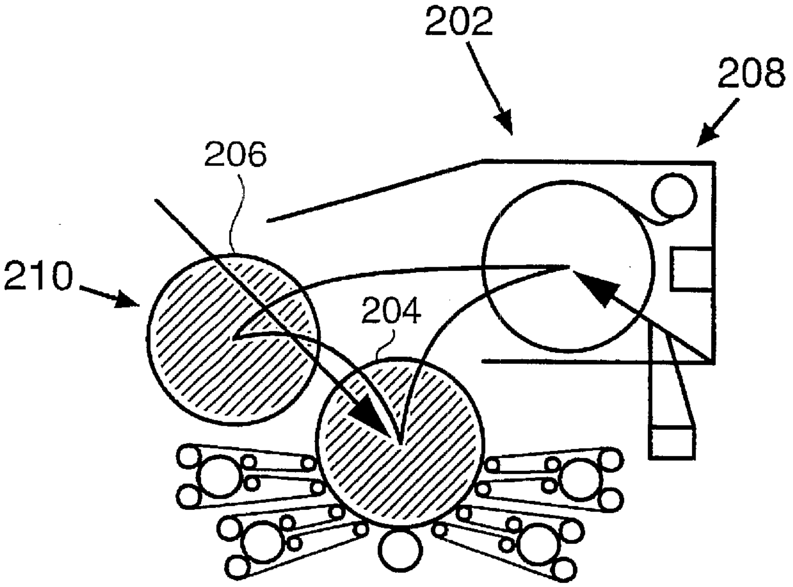
FIG. 12 illustrates a four color short run printing press system utilizing two plate blanket image cylinders, which permit cleaning and imaging of one cylinder to occur while the other cylinder is printing.

For printers presented with large numbers of short runs, press 172 is the most productive. However in some uses, it is not necessary to suffer the cost of three different PBI cylinders in order to make use of the three station concept. For example, in FIG. 12, a press 202 with two PBI cylinders 204 and 206 is shown. In press 202, each PBI cylinder 204 and 206 is independently movable rather than moving in unison, as in press 172 of FIG. 11. After PBI cylinder 204 is through printing, it is moved to a processing station 208, where it has the old printing plate removed, a new blank printing plate attached and the imaging completed. Then the processed PBI cylinder is moved to a ready station 210, where it can be moved into the printing position after PBI cylinder used in the prior printing has completed its job and has been moved to the processing station 208.

Heretofore, the inventive subject matter has been described with respect to conventional printing systems, in which information is printed on paper. However, the invention may also be used in other printing applications. For example, in mass communications, such as newspapers, printing occurs using a plurality of presses because of the massive amount of printing that occurs in a short time period. Further, in recent times newspapers have been printed at remote locations to speed delivery to the readers. In printing with multiple presses, a single master film is generally made which is used to prepare several duplicate printing plates are made for each of the various presses.

Figure 13:
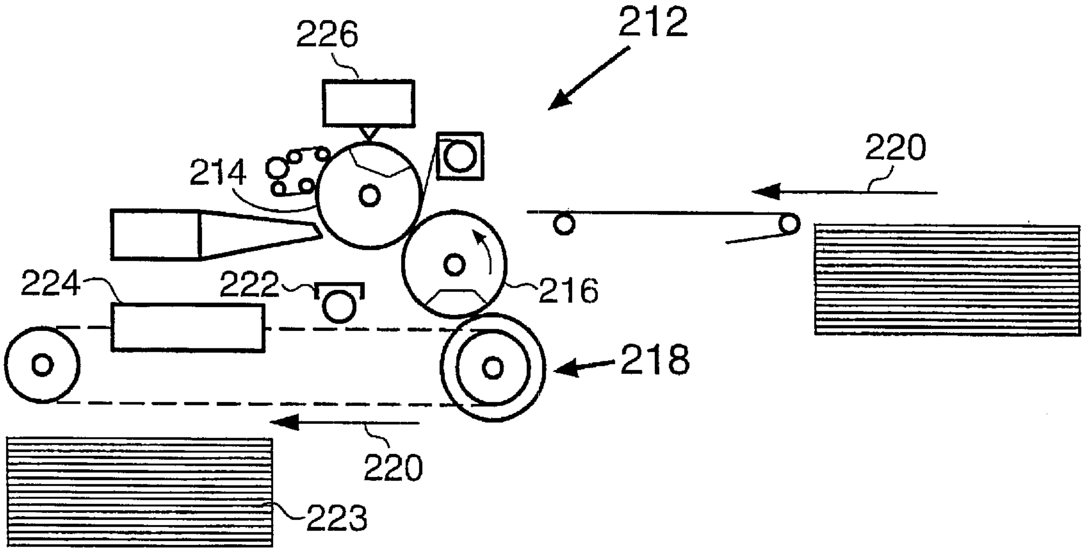
FIG. 13 illustrates a printing system for fabricating duplicates of a conventional lithographic metal printing plate to be subsequently used in a traditional printing system.

FIG. 13 shows an automated printing plate production press 212 for the rapid preparation of multiple, long run, newspaper, commercial or the like, printing plates. Press 212 prints an image on wipe-on lithographic metal with ultraviolet curable ink. Press 212 includes a PSI cylinder 214, an impression cylinder 216 and the other associated systems similar to that shown in FIG. 2. Press 212 further includes a media handling and transporting system 218, which transports and accurately registers pre-punched lithographic metal printing plates 220 typical of the prior art from a stack of blank printing plates. PBI cylinder 214 and impression cylinder 216 may be made to have a larger diameter than shown in FIG. 3 in order to reduce the curvature of printing plate 220 and simplify the transport, clamping and registration of printing plates 220. Alternatively, a flat bed configuration may be used to eliminate bending of the printing plates. When printing plate 220 exits the printing nip, the ultraviolet sensitive ink printed image is cured by radiation from ultraviolet ink lamp 222. Next, gum from a gum Arabic application station 224 is applied to permit handling of the printing plates 220 without contaminating the lithographic surface. Finally, the printing plates are transported to a delivery stack 223, from which they may be taken and placed on existing presses.

PBI cylinder 214 includes a printing plate similar to printing plate 46 described above which has been imaged from an imaging system 226. For multiple location newspapers, imaging system 226 may receive the data defining the image to be printed from over a broad band communication link, such as T1 or T2 telephone lines, from a central location where the newspaper was composed. The stack of printing plates stored in tray 223, may then be the printing plates used to print the newspaper at that remote location.

What is claimed is:

1. A laser ablatable waterless lithographic printing member comprising:

a base material and an imaging layer, said imaging layer comprising silicone and a laser-radiation absorber, wherein said laser ablatable printing member is configured such that after selective laser-ablation of said imaging layer, selective areas of said base material are exposed.

2. A printing system comprising:

a printing cylinder;

a laser ablatable waterless printing member comprising a base material and an imaging layer, said imaging layer comprising silicone and a laser-radiation absorber, said laser ablatable printing member is placed on said printing cylinder; and a laser to ablate selective portions of said imaging layer so as to form an image on said laser ablatable printing member.

* * * * *